US012704602B2

(12) United States Patent
Weigl et al.

(10) Patent No.: US 12,704,602 B2
(45) Date of Patent: Aug. 11, 2026

(54) VCSEL ARRAY WITH SMALL PULSE DELAY

(71) Applicant: TRUMPF Photonic Components GmbH, Ulm (DE)

(72) Inventors: Alexander Weigl, Ulm (DE); Stephan Gronenborn, Ulm (DE); Holger Joachim Moench, Ulm (DE)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 1583 days.

(21) Appl. No.: 17/123,148

(22) Filed: Dec. 16, 2020

(65) Prior Publication Data

US 2021/0104867 A1 Apr. 8, 2021

Related U.S. Application Data

(63) Continuation of application No. PCT/EP2019/065887, filed on Jun. 17, 2019.

(30) Foreign Application Priority Data

Jun. 26, 2018 (EP) .................................... 18179850

(51) Int. Cl.
*G01C 3/08* (2006.01)
*G01S 7/481* (2006.01)
(Continued)

(52) U.S. Cl.
CPC ............ *G01S 7/4815* (2013.01); *G01S 7/484* (2013.01); *G01S 17/10* (2013.01); *G01S 17/894* (2020.01);
(Continued)

(58) Field of Classification Search
CPC ...... G01S 17/894; G01S 17/10; G01S 17/423; G01S 7/484; H01S 5/423; H01S 5/02335; H01S 5/0421; H01S 5/18305
See application file for complete search history.

(56) References Cited

U.S. PATENT DOCUMENTS 7,058,106 B2 6/2006 Widjaja et al.
8,848,757 B2 * 9/2014 Joseph .................... H01S 5/423
372/50.12

(Continued)

FOREIGN PATENT DOCUMENTS

CN 1627577 A 6/2005
CN 104185961 A 12/2014

(Continued)

*Primary Examiner* — Mark Hellner
(74) *Attorney, Agent, or Firm* — LEYDIG, VOIT & MAYER, LTD.

(57) ABSTRACT

A VCSEL array has VCSEL sub-arrays having VCSELs on a substrate. The sub-arrays are electrically contacted by a first electrical contact arrangement common to the VCSELs within a respective sub-array and a second electrical contact arrangement. The second electrical contact arrangement has second electrical contacts contacting a respective VCSEL within the respective sub-array, individually. The second electrical contacts each has a second metal-semiconductor interface to a second semiconductor layer of an associated VCSEL. The second electrical contacts pump the VCSEL along a current path to the first electrical contact arrangement. Current paths between the first electrical contact arrangement and the second electrical contacts via the VCSELs have a symmetry selected out of the group of rotation symmetry, mirror symmetry, and translation symmetry. The first electrical contact arrangement and the second electrical contact arrangement are arranged on the same side of the substrate.

16 Claims, 8 Drawing Sheets

(51) Int. Cl.

| | |
|---|---|
| ***G01S 7/484*** | (2006.01) |
| ***G01S 17/10*** | (2020.01) |
| ***G01S 17/894*** | (2020.01) |
| ***H01S 5/02335*** | (2021.01) |
| ***H01S 5/042*** | (2006.01) |
| ***H01S 5/183*** | (2006.01) |
| ***H01S 5/42*** | (2006.01) |

(52) U.S. Cl.

CPC ........ *H01S 5/02335* (2021.01); *H01S 5/0421* (2013.01); *H01S 5/18305* (2013.01); *H01S 5/18344* (2013.01); *H01S 5/18388* (2013.01); *H01S 5/423* (2013.01)

(56) References Cited

U.S. PATENT DOCUMENTS

| | | | | |
|---|---|---|---|---|
| 2013/0266326 | A1 | 10/2013 | Joseph et al. | |
| 2015/0071320 | A1* | 3/2015 | Gronenborn ............ | H01S 5/183 438/27 |
| 2016/0164261 | A1* | 6/2016 | Warren .................. | H04N 23/11 372/50.122 |
| 2017/0025815 | A1 | 1/2017 | Jiang et al. | |
| 2018/0038944 | A1* | 2/2018 | Hellmig ................ | G01S 17/894 |
| 2019/0386060 | A1 | 12/2019 | Hayakawa et al. | |

FOREIGN PATENT DOCUMENTS

| | | | | |
|---|---|---|---|---|
| CN | 107250841 | A | 10/2017 | |
| CN | 206908092 | U | 1/2018 | |
| CN | 108075357 | A | 5/2018 | |
| EP | 3176888 | A1 | 6/2017 | |
| EP | 3588702 | A1 * | 1/2020 | ............. G01S 17/10 |

* cited by examiner

VCSEL ARRAY WITH SMALL PULSE DELAY

CROSS-REFERENCE TO PRIOR APPLICATIONS

This application is a continuation of International Patent Application No. PCT/EP2019/065887, filed on Jun. 17, 2019, which claims priority to European Patent Application No. EP 18179850.5, filed on Jun. 26, 2018. The entire disclosure of both applications is hereby incorporated by reference herein.

FIELD

The invention relates to a Vertical Cavity Surface Emitting Laser (VCSEL) array with small pulse delay, a lighting device comprising such a VCSEL array, a time-of-flight camera comprising such a VCSEL array or lighting device and a method of manufacturing the VCSEL array.

BACKGROUND

Laser arrangements comprising a laser and especially a VCSEL array can be used for infrared illumination devices. Using short pulses VCSEL arrays are, for example, applied in time-of-flight applications. Such applications comprise e.g. short-range gesture recognition for portable devices and 3D space recognition. VCSEL arrays of about 1 $mm^2$ area with output power in the 1-10 W range are discussed for such applications. Reliability of the measurements depends on precise timing of the short pulses emitted by the VCSEL array.

US 2015/0071320 A1 discloses a method of manufacturing a VCSEL module comprising at least one VCSEL chip with a plurality of VCSEL units and a common carrier structure. The method comprises dividing the VCSEL chip into a plurality of sub-arrays with at least one VCSEL unit each and electrically connecting at least some of the sub-arrays in series.

SUMMARY

An embodiment of the present invention provides a Vertical Cavity Surface Emitting Laser (VCSEL) array that has at least two VCSEL sub-arrays, each of the VCSEL sub-arrays having a plurality of VCSELs arranged on a substrate. The at least two VCSEL sub-arrays are electrically contacted by a first electrical contact arrangement common to the VCSELs within a respective VCSEL sub-array, of the VCSEL sub-arrays, and a second electrical contact arrangement. The second electrical contact arrangement has a plurality of second electrical contacts, each of the second electrical contacts contacting a respective single VCSEL within the respective VCSEL sub-array, individually. Each of the second electrical contacts has a second metal-semiconductor interface to a second semiconductor layer of an associated VCSEL of the plurality of VCSELs. The second electrical contacts are arranged to electrically pump the associated VCSEL along a respective current path, of a plurality of current paths, to the first electrical contact arrangement. The current paths between the first electrical contact arrangement common to the VCSELs within the respective VCSEL sub-array and the second electrical contacts via the plurality of VCSELs are characterized by at least one symmetry selected out of the group of rotation symmetry, mirror symmetry, and translation symmetry. The first electrical contact arrangement and the second electrical contact arrangement are arranged on the same side of the substrate.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
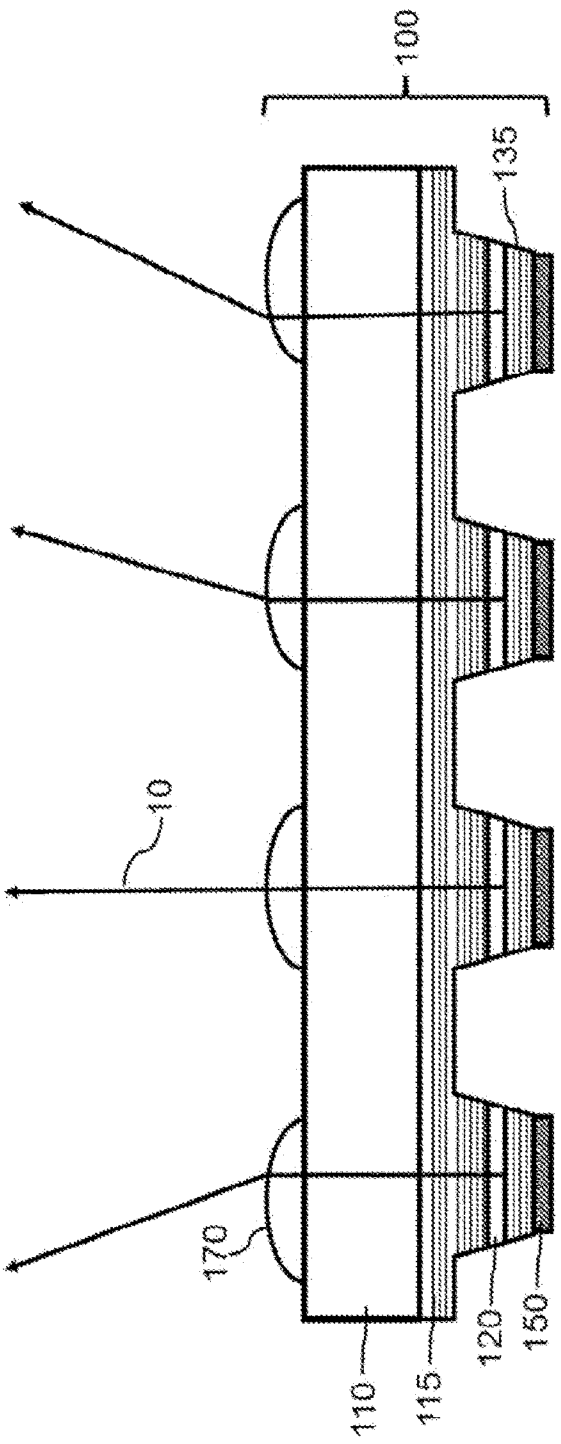
FIG. 1 shows a principal sketch of a first cross-section of a VCSEL array.

Embodiments of the present invention provide a VCSEL array with improved reliability.

According to a first aspect of the present invention, a Vertical Cavity Surface Emitting Laser (VCSEL) array is provided. The VCSEL array comprises at least two VCSEL sub-arrays. Each VCSEL sub-array comprises a multitude of VCSELs arranged on a substrate. The at least two VCSEL sub-arrays are electrically contacted by means of a first electrical contact arrangement common to the VCSELs within the respective VCSEL sub-array, and a second electrical contact arrangement. The second electrical contact arrangement comprises a multitude of second electrical contacts, each second electrical contact contacting a respective single VCSEL within the respective VCSEL sub-array individually. Each second electrical contact comprises a second metal-semiconductor interface to a second semiconductor layer of an associated VCSEL of the multitude of VCSELs. The second electrical contacts are arranged to electrically pump the associated VCSEL of the multitude of VCSELs along a current path to the first electrical contact arrangement. The current paths between the first electrical contact arrangement common to the VCSELs within the respective sub-array and the second electrical contacts via the multitude of VCSELs are characterized by at least one symmetry selected out of the group of rotation symmetry, mirror symmetry and translation symmetry. The first electrical contact arrangement and the second electrical contact arrangement are arranged on the same side of the substrate.

The symmetry of the current paths, or to rephrase it, the symmetry of the arrangement of the contacts to provide the currents to the VCSELs within the sub-arrays, may avoid or at least limits variations of impedances along the different current paths in comparison to asymmetric arrangements. The smaller the variations of the impedances (especially different resistance and inductance of the current paths across the different VCSELs) are, the smaller are potential delays of optical pulses, which are emitted by the different VCSELs, which are comprised by the respective sub-array. The smaller the delays of optical pulses between different VCSELs are, the more precise is a measurement of the time of flight in the field of view of the VCSEL array because the start time of the optical pulse is needed in combination with the time of reception of the reflected laser light to determine the time-of-flight (round trip time). Furthermore, design of an evaluator for evaluating the time-of-flight may be simplified because there may be no need to take into account different start times of the optical pulses. The VCSEL array may comprise two, three, four or more VCSEL sub-arrays.

The current paths are defined by the path between the electrical contact that contacts each single VCSEL individually and the one or more electrical contacts providing a common electrical contact to each VCSEL sub-array. Each VCSEL comprises an optical resonator comprising the first DBR, the active layer, and the second DBR (and optionally some intermediate support layers like, for example, current apertures, matching layers and the like). Each current path therefore comprises a path through the optical resonator of the corresponding VCSEL and, for example, a path through the substrate or current distribution layer to the common electrical contact. The first electrical contact arrangement may, for example, comprise a first electrical contact structure electrically connected with at least one first electrical contact. The first electrical contact is arranged to electrically contact the substrate or current distribution layer. The current paths are in this embodiment defined between a contact area (metal-semiconductor interface) of the at least one first electrical contact to the optical resonator (e.g. via the substrate or current distribution layer within one of the DBRs) and the contact areas (metal-semiconductor interfaces) of the second electrical contacts. The arrangement of the first electrical contact and the second electrical contacts determines the symmetry of the current paths and is therefore characterized by the same symmetry.

The substrate of the at least two VCSEL sub-arrays may be a common substrate. The current paths between a first electrical contact arrangement of a first VCSEL sub-array and second electrical contacts via the multitude of VCSELs of the first VCSEL sub-array and a second electrical contact arrangement of a second VCSEL sub-array and second electrical contacts via the multitude of VCSELs of the second VCSEL sub-array are characterized by at least one symmetry selected out of the group of rotation symmetry, mirror symmetry and translation symmetry. The symmetry is again caused by the positions of the corresponding contacts. Arranging the two sub-arrays symmetrically on the same substrate may further reduce potential delays of the start time of the optical pulses such that reliability of a time-of-flight measurement may be improved. The VCSEL array may comprise two, three, four, or more groups of first and second VCSEL sub-arrays which are symmetrically arranged on the common substrate.

The first electrical contact arrangement may be arranged to provide a cathode contact to the VCSELs. The second electrical contact arrangement is in this case arranged to provide an anode contact to the VCSELs. The first electrical contact arrangement may be arranged to contact the substrate if the substrate is n-doped (e.g. gallium arsenide growth substrate which can be provided in high quality and low cost).

The first electrical contact arrangement may, according to an alternative embodiment, be arranged to provide an anode contact to the VCSELs. The second electrical contact arrangement is in this embodiment arranged to provide a cathode contact to the VCSELs. The VCSELs may in this embodiment comprise a tunnel diode. This arrangement may be beneficial to decrease electrical losses as described, for example, in EP 0 986 846 B1, which is incorporated by reference.

The first VCSEL sub-array and the second VCSEL sub-array and any further VCSEL sub-array comprised by the VCSEL array may be electrically contacted by a common first electrical contact arrangement.

The current paths may be arranged such that a length of a longest current path along the substrate and the respective VCSEL is smaller than 4 times, preferably smaller than 2 times and most preferably smaller than 1.5 times a length of a shortest current path along the substrate and the respective VCSEL. The current paths may be arranged such that a difference of the electrical impedance of the different current paths along the substrate and the respective VCSELs is smaller than 50%, more preferably the smaller than 20%, and most preferably smaller than 10%, of the smallest impedance of the current paths.

The current paths may be arranged such that electrical impedances of the current paths along the respective VCSELs of the first VCSEL sub-array are the same as electrical impedances of the current path along the respective VCSEL of the second VCSEL sub-array. The symmetry of the current path may be arranged such that the impedances of pairs of VCSEL sub-arrays are essentially identical (up to production tolerances).

The current paths may especially be arranged such that an electrical impedance of the current paths along the respective VCSELs is essentially the same (up to production tolerances). The VCSELs may, for example, be arranged around a common first electrical contact in a rotational symmetric arrangement. The VCSELs may according to an alternative embodiment be arranged in a linear arrangement along an elongated first electrical contact.

The VCSELs may be bottom emitters, which are arranged to emit laser light through the substrate or in a direction of the substrate if the substrate is (e.g. locally) removed to avoid or at least reduce absorption of the emitted laser light. The VCSEL array may in this case be characterized by a flip chip arrangement comprising a multitude of bumps. The bumps are arranged to mount the VCSEL array on a carrier. The bumps are further arranged to provide an electrical connection to the first electrical contact arrangement and the second electrical contact arrangement. The bumps are arranged on a side of the substrate opposite to a light emission side of the VCSEL array. The flip chip arrangement may enable a simplified assembly of devices comprising the VCSEL array.

The bumps may be arranged in a regular pattern. The regular pattern may support the total symmetry of impedances or current paths beyond the optical resonators and the substrate to reduce variations or differences of the total impedances within a device comprising the VCSEL array.

The VCSEL array comprising bottom emitting VCSELs may comprise at least one optical structure. The optical structure may be arranged (e.g., by etching) in a side of the substrate opposite to the side on which the VCSELs are arranged. The optical structure is arranged to transform laser light emitted by the VCSEL array during operation of the VCSEL array. The optical structure is mechanically protected by a protection structure comprising substrate material comprised by the substrate. The protection structure is arranged to avoid mechanical contact to the optical structure.

The optical structure may, for example, be arranged to transform the laser light by focusing and/or redirecting the laser light. The optical structure may comprise a single optical element or a multitude of optical elements, which are arranged to individually transform laser light emitted by the VCSELs. The highest points of the protection structure may define a plane which does not intersect the optical structure. The protection structure may surround the optical structure or parts of the optical structure.

The protection structure may be aligned with the bumps such that a bending of the substrate between two bumps is reduced when a force perpendicular to a plane of the VCSEL array is exerted to the protection structure. The alignment of the protection structure with the bumps may directly transfer forces exerted to the VCSEL array to a carrier on which the VCSEL array may be mounted by means of the bumps. The plane of the VCSEL array may be a plane parallel to one of the surfaces of the substrate.

The VCSELs may according to an alternative embodiment be top emitters. The VCSELs may be arranged to emit laser light in a direction away from the substrate. The VCSEL array may, for example, comprise in this embodiment electrical contact pads, which are arranged to electrically contact the first and the second electrical contact arrangement(s) by means of wire bonds.

According to a second aspect, a light emitting device is provided. The light emitting device comprises at least one VCSEL array as described above and an electrical driver for electrically driving the VCSELs. The light emitting device may further comprise a controller for providing control signals for controlling the electrical driver. The controller may, for example, comprise a storage device for storing data and a processing device for executing instructions comprised by the stored data. The stored data may, for example, comprise a sequence of providing an electrical drive current to the VCSELs or VCSEL sub-arrays.

The VCSEL array or lighting device may be used in consumer devices (e.g. smartphones), vehicles, as well as high power industrial applications in order to support: consumer and portable applications as gesture interface or 3D scanner in smart-phones, lap-top, tablet, etc., user interface or indoor navigation for robotics, sports, industry, lighting, etc. high end for automotive mid-range detection (park assist, safe city driving); and high power industrial applications.

According to a third aspect, a time-of-flight camera is provided. The time-of-flight camera comprises the VCSEL array or light emitting device according to any embodiment described above, a light detector, optionally an optical arrangement and an evaluator. The optical arrangement may be arranged to focus transformed laser light emitted by the laser arrangement and reflected by an object to the light detector. The evaluator is arranged to determine a distance to the object by means of the image of the transformed laser light detected by the light detector.

According to a fourth aspect, a method of fabricating or manufacturing a VCSEL array according to any embodiment described above is provided. The method comprises the steps of:

providing a Vertical Cavity Surface Emitting Laser (VCSEL) array comprising at least two VCSEL sub-arrays, wherein each VCSEL sub-array comprises a multitude of VCSELs arranged on a substrate, electrically contacting the at least two VCSEL sub-arrays by means of a first electrical contact arrangement common to the VCSELs within the respective VCSEL sub-array, and a second electrical contact arrangement, wherein the second electrical contact arrangement comprises a multitude of second electrical contacts, each second electrical contact contacting a respective single VCSEL within the respective VCSEL sub-array individually, wherein each second electrical contact comprises a second metal-semiconductor interface to a second semiconductor layer of an associated VCSEL of the multitude of VCSELs, wherein the second electrical contacts are arranged to electrically pump the associated VCSEL along a current path to the first electrical contact arrangement, wherein the first electrical contact arrangement and the second electrical contacts are arranged such that the current paths between the first electrical contact arrangement common to the VCSELs within the respective sub-array and the second electrical contacts via the multitude of VCSELs are characterized by at least one symmetry selected out of the group of rotation symmetry, mirror symmetry and translation symmetry. The first electrical contact arrangement and the second electrical contact arrangement are arranged on the same side of the substrate.

The steps need not necessarily be performed in the order given above. The different layers comprised by the VCSEL array may be deposited by epitaxial methods like MOCVD, MBE and the like. The method may comprise further steps to manufacture any VCSEL array described above.

It shall be understood that the VCSEL array, the light emitting device and the method of manufacturing the VCSEL array have similar and/or identical embodiments.

Further advantageous embodiments are defined below.

These and other aspects of the invention will be apparent from and elucidated with reference to the embodiments described hereinafter.

The invention will now be described, by way of example, based on embodiments with reference to the accompanying drawings.

In the Figures, like numbers refer to like objects throughout. Objects in the Figures are not necessarily drawn to scale.

FIG. 1 shows a principal sketch of a first cross-section of a first VCSEL array 100. The cross section of the VCSEL array 100 shows four bottom emitting VCSELs, which are processed on a gallium arsenide substrate 110. Each VCSEL comprises an optical resonator comprising a first DBR 115, an active layer 120, and a second DBR 135. The first DBR 115 is processed on the substrate 110, and the active layer 120 is sandwiched between the first DBR 115 and the second DBR 135. The first DBR 115 and the second DBR 135 comprise a multitude of pair of layers with different refractive indices to provide the reflectivity. The active layer 120 may comprise one or more quantum well layers. The optical resonators are characterized by a mesa structure, which is etched down to an intermediate layer of the first DBR 115. The uppermost layer of the second DBR of each mesa is covered by second electrical contacts 150 to individually contact each VCSEL. The side of the substrate 110, which is arranged opposite to the processing side on which the optical resonators are processed, are etched such that each VCSEL is associated with a corresponding optical structure 170. The optical structure 170 are lenses which are decentered with respect to a center line of the associated VCSEL perpendicular to the substrate 110. The lenses are arranged to focus laser light 10 emitted during operation of the VCSEL array 100 and to spread the laser light 10 to illuminate a defined field-of-view. An example of the electrical contacting of the substrate 110 is discussed with respect to FIG. 2.

Figure 2:
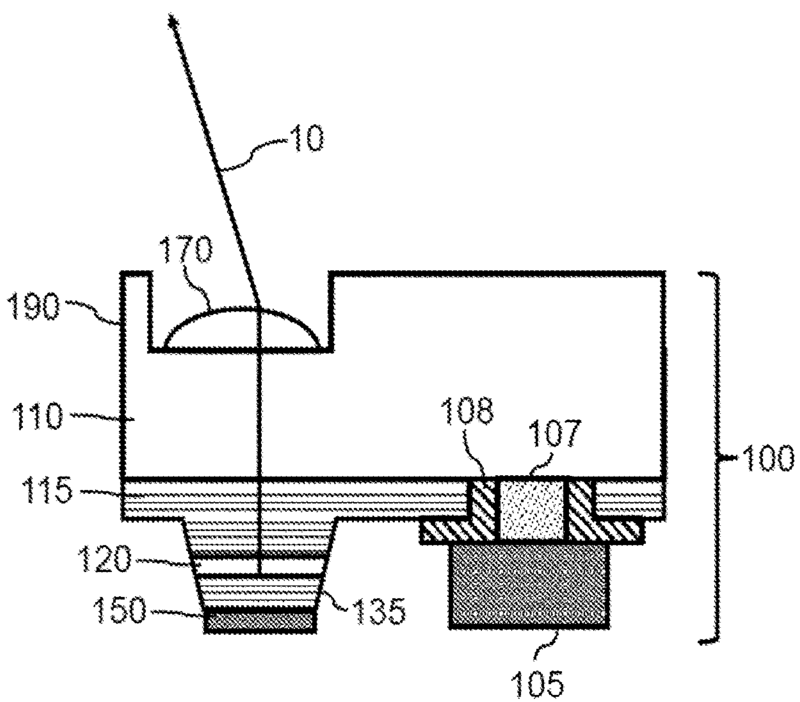
FIG. 2 shows a principal sketch of a second cross-section of a VCSEL array.

FIG. 2 shows a principal sketch of a second cross-section of the VCSEL array 100 which is perpendicular to the cross-section discussed with respect to FIG. 1. FIG. 2 shows electrical contacting of one single VCSEL sub-array comprised by the VCSEL array 100. The optical device 170 (lens) etched in the substrate 110 is bordered by a protection structure 190 which comprises in this embodiment the original surface of the substrate 110. The protection structure 190 avoids or at least reduces the risk that the lens can be touched. The substrate 110 is electrically contacted by etching a hole in the first DBR 115. An electrical isolator 108 is deposited and subsequently partly removed such that a first electrical contact 107 comprising an electrically conductive material (metal) is deposited to provide an electrical contact to the substrate 110. The first electrical contact 107 is separated from the first DBR 115 by means of the electrical isolator 108. A first electrical contact structure 105 (e.g. metal layer) is subsequently deposited and structured to enable an electrical contact to the substrate 110. A first electrical contact arrangement comprises in this embodiment the first electrical contact structure 105 and the first electrical contact 107. The first electrical contact 107 shares with the substrate 110 an interface which is the so-called contact area (metal-semiconductor interface). The current path is in this embodiment defined by a path starting at the contact area, passes the substrate 110 and ends at the contact areas (metal-semiconductor interface) of the second electrical contacts 150 after passing the first DBR 115, the active layer 120 and the second DBR 135. The current path is not a single one-dimensional line but describes the path along which most of the current flows from the contact area to the respective second electrical contact 150. Each VCSEL may comprise further layers like current apertures, stress matching layers and the like. The first electrical contact arrangement 105, 107 and the second electrical contact arrangement 150, 155 are arranged on the same side of the substrate 110.

Figure 3:
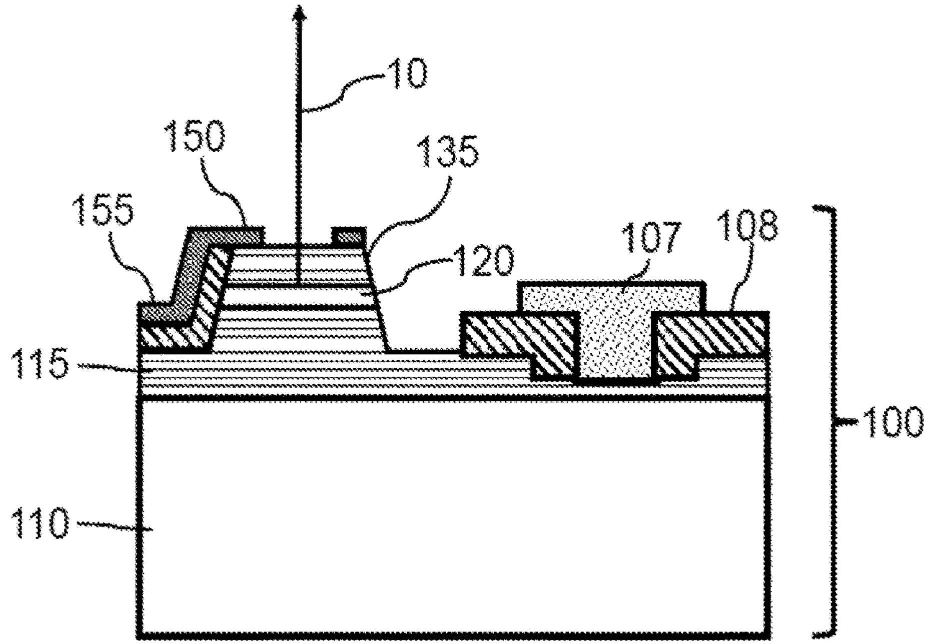
FIG. 3 shows a principal sketch of a cross-section of a second VCSEL array.

FIG. 3 shows a principal sketch of a cross-section of a second VCSEL array 100. The cross-section is similar as discussed with respect to FIG. 2 showing only one VCSEL sub-array of the VCSEL array 100. The VCSEL array 100 comprises in this case a multitude of top emitting VCSELs, which emit laser light 10 in a direction away from the substrate 110. Each VCSEL comprises an optical resonator as discussed with respect to FIG. 1, which is arranged in a mesa as discussed above. The substrate 110 is again contacted by means of a first electrical contact arrangement, which consists in this case of a first electrical contact structure 107 having a metal-semiconductor interface with one layer of the first DBR 115 (current distribution layer). The second electrical contact 150 (metal contact) electrically contacts the uppermost layer of the second DBR 135 and is electrically isolated with respect to the active layer and the first DBR 115 by means of an electrical isolator 108. The second electrical contact 150 is ring shaped such that the laser light 10 is emitted through the opening of the contact ring. The current path is defined by a path starting at a contact area (metal-semiconductor interface) between the current distribution layer and the first electrical contact 107, passes the current distribution layer and ends at the contact area (metal-semiconductor interface) of the second electrical contact 150 after passing the first DBR 115, the active layer 120 and the second DBR 135.

Figure 4:
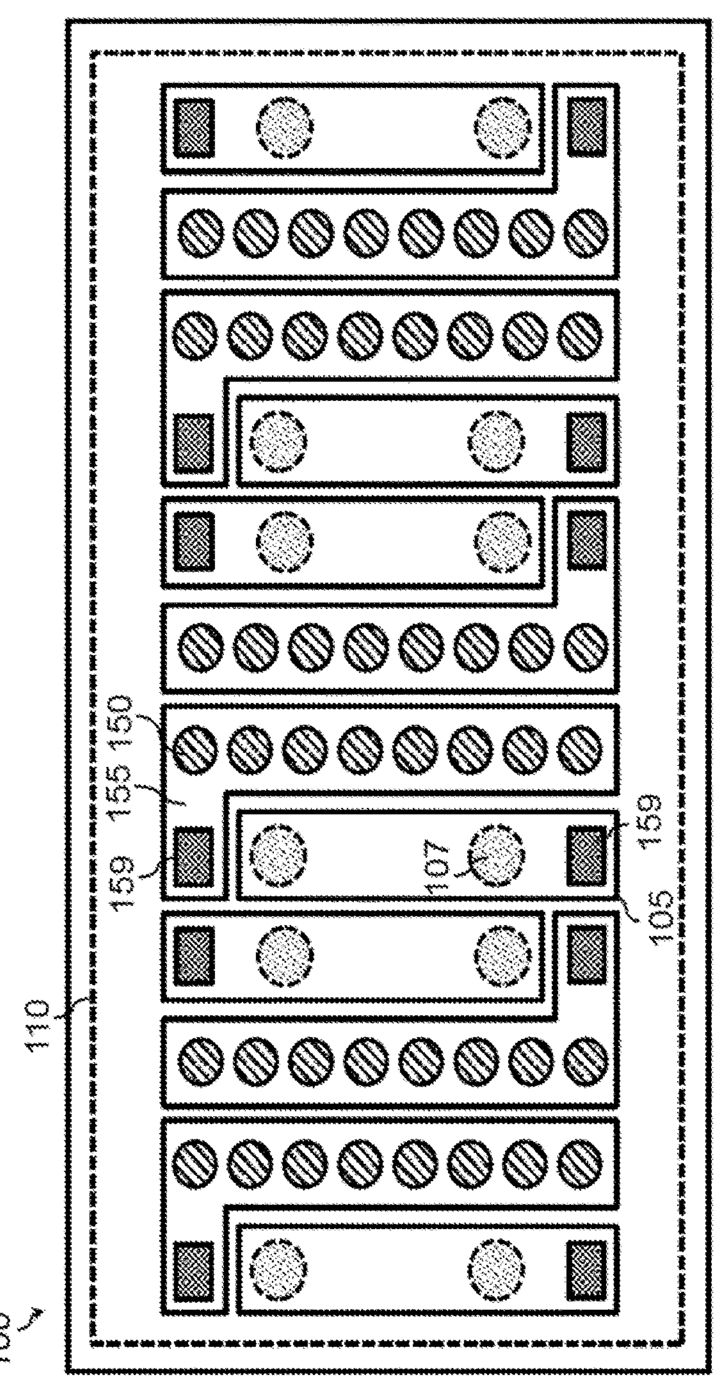
FIG. 4 shows a principal sketch of a third VCSEL array.

FIG. 4 shows a principal sketch of a third VCSEL array 100. FIG. 4 shows a top view of the second VCSEL array

100 comprising bottom emitting VCSELs, which are arranged in six VCSEL sub-arrays. The electrical contacting of the VCSELs is essentially the same as discussed with respect to FIG. 2. The third VCSEL array 100 comprises a substrate 110 on which the optical resonators of the VCSELs are processed. Each VCSEL is electrically contacted by a circular second electrical contact 150 covering the uppermost layer of the second DBR 135 as discussed with respect to FIGS. 1 and 2. The second electrical contacts 150 of the VCSELs comprised by one VCSEL sub-array are electrically connected to each other by means of an L-shaped second electrical contact structure 155. The second electrical contacts 150 and the second electrical contact structure 155 built in this embodiment the second electrical contact arrangement. Each VCSEL sub-array comprises in this embodiment a separate first electrical contact arrangement which comprises a first electrical contact structure 105 contacting two circular first electrical contacts 107 as described with respect to FIG. 2. The first electrical contacts 107 and the second electrical contacts 150 of each VCSEL sub-array are arranged such that there is a mirror symmetry of the current paths of the upper four VCSELs and the lower four VCSELs. Furthermore, there is a mirror symmetry of the current paths between neighboring VCSEL sub-arrays (e.g. between the first VCSEL sub-array and the second VCSEL sub-array) starting from left to right in FIG. 4. The symmetric arrangement within the VCSEL sub-arrays and between the VCSEL sub-arrays limits the difference of the lengths of the different current paths. Furthermore, the shape of the current paths is similar such that the difference between the impedances along the different current paths are limited. The second VCSEL array further comprises bumps 159, which are arranged in a regular pattern. Each first electrical contact arrangement 105, 107 and second electrical contact arrangement 150, 155 are electrically contacted by one corresponding bump 159 (see also FIG. 8). The material, shape and thickness of the first electrical contact arrangement 105, 107 and the second electrical contact arrangement 150, 155 are chosen such that the contribution to the total impedance is minimized.

Figure 5:
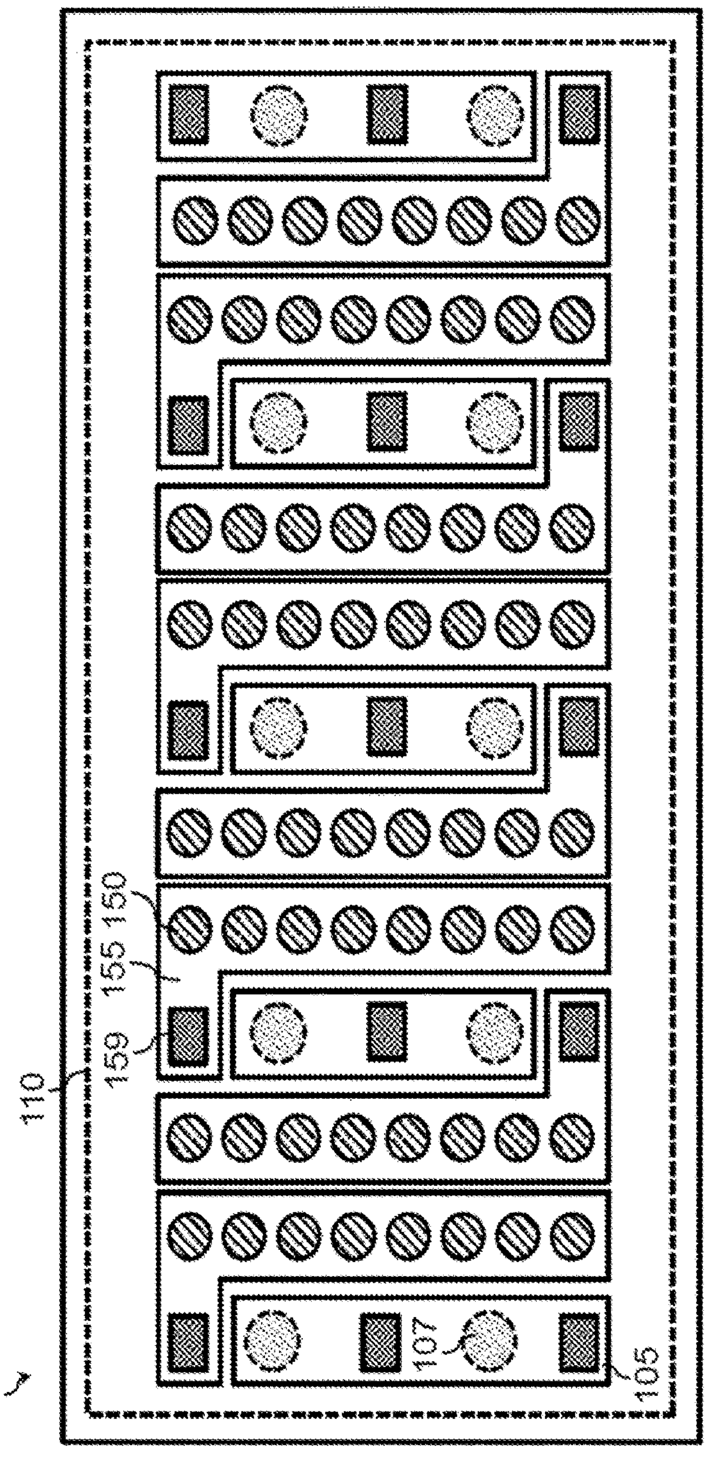
FIG. 5 shows a principal sketch of a fourth VCSEL array.

FIG. 5 shows a principal sketch of a fourth VCSEL array 100. The general configuration is very similar as discussed with respect to FIG. 4. The VCSEL array 100 comprises eight VCSEL sub-arrays. The six VCSEL sub-arrays arranged in the middle of the VCSEL array are arranged such that two VCSEL sub-arrays are arranged around one common first electrical contact arrangement 105, 107. The outer VCSEL sub-arrays comprise each a separate first electrical contact arrangement 105, 107. The symmetries are essentially the same as discussed with respect to FIG. 4. A rotation of 180° of the VCSEL array 100 around a central axis perpendicular to the plane of FIG. 5 results in the same picture shown in FIG. 5.

Figure 6:
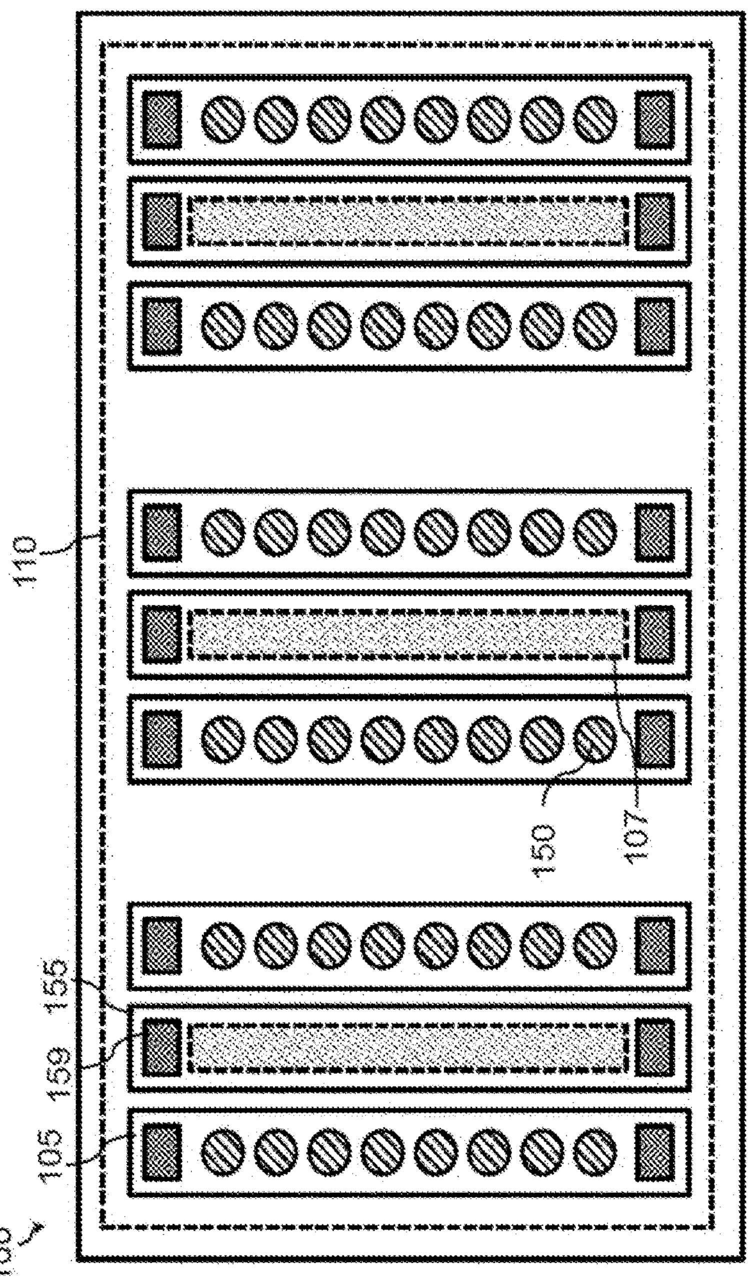
FIG. 6 shows a principal sketch of a fifth VCSEL array.

FIG. 6 shows a principal sketch of a fifth VCSEL array 100. The general configuration is again similar as discussed with respect to FIGS. 4 and 5. Two VCSEL sub-arrays are arranged around one common first electrical contact arrangement 105, 107. The first electrical contact 107 is in this embodiment rectangular and extends parallel to the longitudinal extension of the VCSELs comprised by the VCSEL sub-arrays. The electrical impedances of the current paths between the contact area of the first electrical contact 107 and the second electrical contacts 150 is therefore essentially identical. Each first electrical contact arrangement 105, 107 and second electrical contact arrangement 150, 155 are in this embodiment electrically contacted by two corresponding bumps 159 (see also FIG. 8). The conductivity of the first electrical contact structure 105 and the second electrical contact structure 155 is preferably high (e.g. metal layer) such that the contribution to the total impedance is low (essentially negligible).

Figure 7:
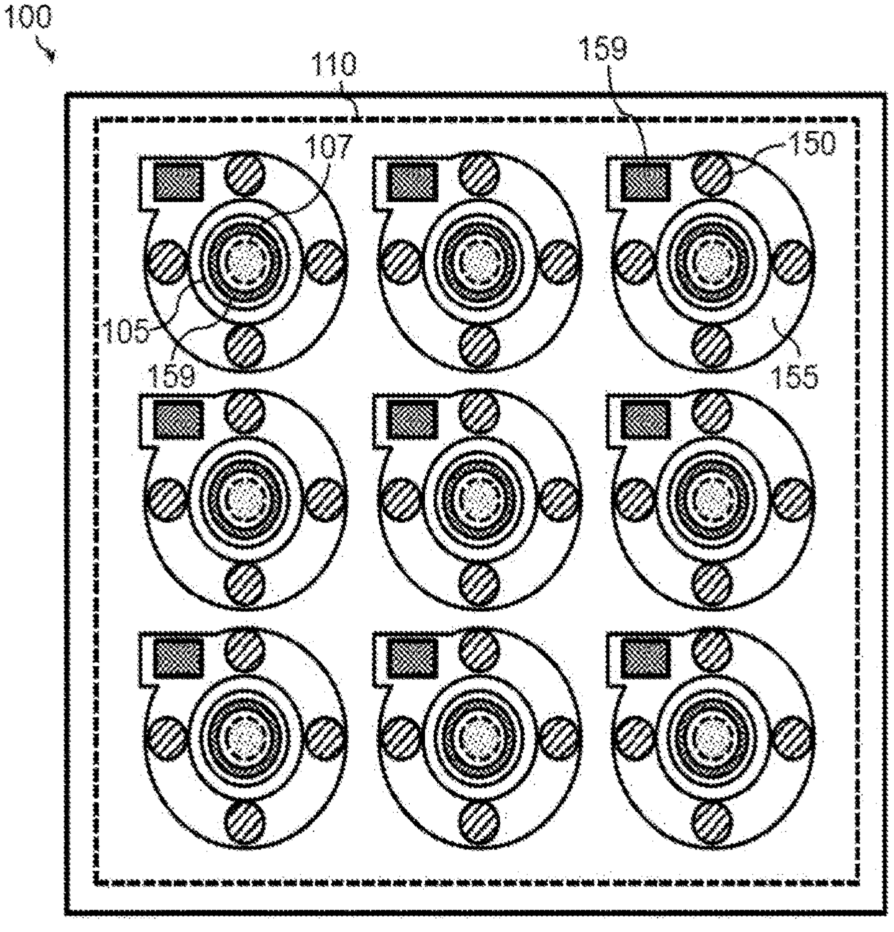
FIG. 7 shows a principal sketch of a sixth VCSEL array.

FIG. 7 shows a principal sketch of a sixth VCSEL array 100. FIG. 7 shows, like FIGS. 4, 5 and 6, a top view of the sixth VCSEL array 100 comprising bottom emitting VCSELs, which are arranged in nine VCSEL sub-arrays. The electrical contacting of the VCSELs is essentially the same as discussed with respect to FIG. 2. The fifth VCSEL array 100 comprises a substrate 110 on which the optical resonators of the VCSELs are processed. Each VCSEL is electrically contacted by a circular second electrical contact 150 covering the uppermost layer of the second DBR 135 as discussed with respect to FIGS. 1 and 2. The second electrical contacts 150 of the VCSELs comprised by one VCSEL sub-array are electrically connected to each other by means of a circular second electrical contact structure 155. The second electrical contacts 150 and the second electrical contact structure 155 built in this embodiment the second electrical contact arrangement. Each VCSEL sub-array comprises in this embodiment a separate first electrical contact arrangement which comprises a circular first electrical contact structure 105 contacting one circular first electrical contacts 107 as described with respect to FIG. 2. The first electrical contacts 107 and the second electrical contacts 150 of each VCSEL sub-array are arranged such that there is a rotation symmetry of the current paths of the four VCSELs arranged around the respective first electrical contact 107. Furthermore, there is a translation symmetry of the current paths between neighboring VCSEL sub-arrays. The symmetric arrangement within the VCSEL sub-arrays and between the VCSEL sub-arrays results in an essentially identical impedance of the current paths. The sixth VCSEL array 100 further comprises bumps 159 which are arranged in a regular pattern. Each first electrical contact arrangement 105, 107 and second electrical contact arrangement 150, 155 are electrically contacted by one corresponding bump 159 (see also FIG. 8).

Figure 8:
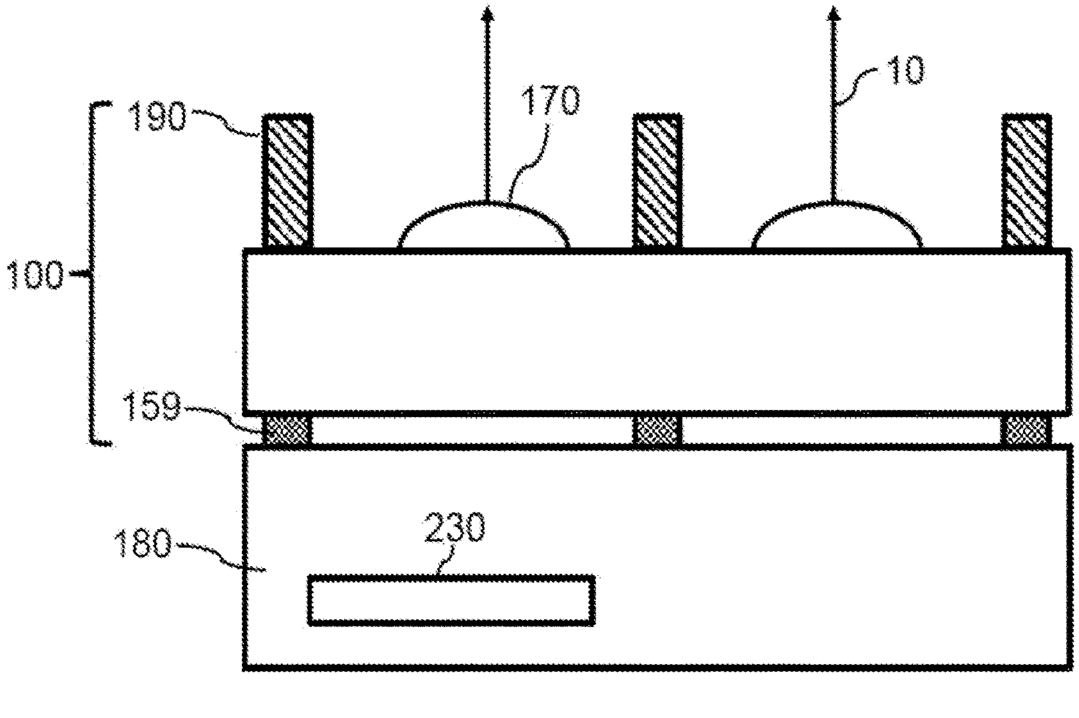
FIG. 8 shows a principal sketch of a lighting device.

FIG. 8 shows a principal sketch of a cross-section of a lighting device comprising a VCSEL array 100. The VCSEL array 100 is mounted by means of bumps 159 on a carrier 180, which comprises an electrical driver 230. The electrical driver 230 is arranged to provide an electrical drive current to the VCSEL array 100 via the bumps 159 such that laser light 10 is emitted by the VCSELs and focused by means of optical structures 170 (lenses), which are associated with the respective VCSELs. The lenses are protected by means of a protection structure 190 which is aligned with the bumps 159. A mechanical force exerted to the protection structure 190 is therefore essentially completely transferred to the carrier 180 by means of the aligned bumps 159. Bending of the substrate of the VCSEL array 100 between the bumps 159 may therefore be reduced.

Figure 9:
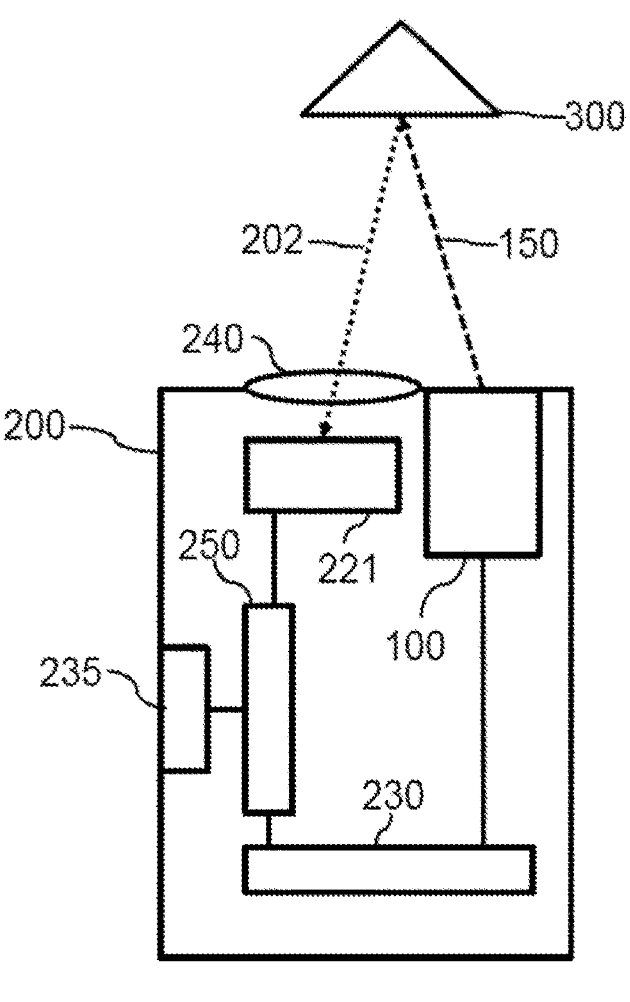
FIG. 9 shows a principal sketch of a time-of-flight camera.

FIG. 9 shows a principal sketch of a time-of-flight camera 200. The time-of-flight camera 200 comprises a VCSEL array 100 in accordance with one of the embodiments discussed above. The time-of-flight camera 200 further comprises a detector 221, which is arranged to detect very short light pulses. Such short laser pulses may be caused by transformed laser light 150 emitted by lasers comprised by the VCSEL array 100 hitting an object 300. A part of the transformed laser light 150 is reflected by the object 300 such that reflected laser light 202 is received by optical device 240 (e.g. lens or lens arrangement) which images or focuses the received laser light to detector 221. The reflected laser light 202 causes a corresponding electrical signal in the detector 221. An electrical driver 230 may be arranged to electrically drive the VCSEL array 100 or optionally each VCSEL or VCSEL sub-array of the VCSEL array 100 separately. A controller 250 is connected to the electrical driver 230 in order to control, for example, start and stop time of the laser pulses emitted by VCSEL array 100. The controller 250 is further connected with the detector 221 in order to receive the electrical signal caused by the reflected laser light 202 detected by detector 221. The time-of-flight camera 200 further comprises an optional interface 235 to transfer start and stop time (or the corresponding raw data) of the transformed laser light 150 emitted by the corresponding VCSEL or group of VCSELs as well as time of reception of the electrical signal caused by the reflected laser light 202. The transferred data can be used to calculate the time-of-flight of the laser light and therefore a distance between the time-of-flight camera 200 and the object 300. The time-of-flight camera 200 may alternatively comprise an evaluator electrically connected with the controller 250 (or may comprise or be comprised by controller 250) in order to determine the distance(s) to the object. Several distance measurements may be used to determine a velocity or even an acceleration of the object 300. The symmetry of the arrangement of the current paths avoids that there is a big difference between the starting times of the laser pulses after providing a corresponding current pulse to the VCSELs.

Figure 10:
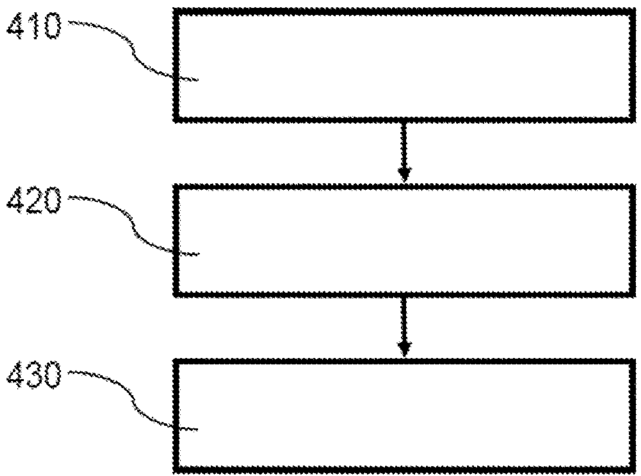
FIG. 10 shows a principal sketch of a method of fabricating a VCSEL array

FIG. 10 shows a principal sketch of a method of fabricating a VCSEL array 100. A Vertical Cavity Surface Emitting Laser (VCSEL) array 100 is provided in step 410. The VCSEL array 100 comprises at least two VCSEL sub-arrays, wherein each VCSEL sub-array comprises a multitude of VCSELs arranged on a substrate 110. The at least two VCSEL sub-arrays are electrically contacted in step 420 by means of a first electrical contact arrangement 105, 107 and a second electrical contact arrangement 150, 155. The second electrical contact arrangement 150, 155 comprises a multitude of second electrical contacts. The second electrical contacts 150 are arranged to electrically pump an associated VCSEL of the multitude of VCSELs along a current path to the first electrical contact arrangement 105, 107. In step 430 current paths between the first electrical contact arrangement 105, 107 and the second electrical contacts 150 via the multitude of VCSELs are arranged such that the current paths are characterized by at least one symmetry selected out of the group of rotation symmetry, mirror symmetry and translation symmetry.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word “comprising” does not exclude other elements or steps, and the indefinite article “a” or “an” does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

10 laser light
100 Vertical Cavity Surface Emitting Laser (VCSEL) array
105 first electrical contact structure
107 first electrical contact
108 electrical isolator
110 substrate
115 first distributed Bragg reflector (DBR)
120 active layer
135 second DBR
150 second electrical contact
155 second electrical contact structure
159 bump
170 optical structure
180 carrier
190 protection structure
200 time of flight camera
202 reflected laser light
221 light detector
230 electrical driver
235 interface
240 optical device
250 controller
300 object
410 step of providing VCSEL array
420 step of electrically contacting the at least two VCSEL sub-array
430 step of arranging current paths

The invention claimed is:

1. A Vertical Cavity Surface Emitting Laser (VCSEL) array, the VCSEL array comprising:

at least two VCSEL sub-arrays, each of the VCSEL sub-arrays comprising a plurality of VCSELs arranged on a substrate, each VCSEL having an optical resonator comprising a first distributed Bragg reflector, an active layer, and a second distributed Bragg reflector, wherein each VCSEL is processed on the substrate, and wherein a current distribution layer is disposed within one of the first distributed Bragg reflector and the second distributed Bragg reflector, a first electrical contact arrangement having a first contact area contacting the substrate or the current distribution layer, wherein the first electrical contact arrangement comprises at least one first electrical contact contacting commonly the VCSELs within a respective VCSEL sub-array, of the VCSEL sub-arrays, at the first contact area to the optical resonator of the respective VCSEL via the substrate or via the current distribution layer, and a second electrical contact arrangement having a second contact area contacting an uppermost layer of the second distributed Bragg reflector, wherein the second electrical contact arrangement comprises a plurality of second electrical contacts, each second electrical contact contacting a respective single VCSEL within the respective VCSEL sub-array, individually, at the second contact area to a semiconductor layer of the optical resonator of the respective VCSEL, wherein the second electrical contacts are arranged to electrically pump the associated VCSEL along a respective current path through the optical resonator of the associated VCSEL between the first contact area and the second contact area via the substrate or the current distribution layer, wherein an arrangement of the at least one first electrical contact and the second electrical contacts has at least one symmetry selected from the group of rotation symmetry, mirror symmetry, and translation symmetry, and wherein the first electrical contact arrangement and the second electrical contact arrangement are arranged on the same side of the substrate.

2. The VCSEL array according to claim 1, wherein the substrate of the at least two VCSEL sub-arrays is a common substrate, and wherein current paths between the first electrical contact arrangement of a first VCSEL sub-array, of the at least two VCSEL sub-arrays, and the second electrical contacts via the plurality of VCSELs of the first VCSEL sub-array, and current paths between the first electrical contact arrangement of a second VCSEL sub-array, of the at least two VCSEL sub-arrays, and the second electrical contacts via the plurality of VCSELs of the second VCSEL sub-array are characterized by at least one symmetry selected out of the group of rotation symmetry, mirror symmetry, and translation symmetry.

3. The VCSEL array according to-claim 1, wherein the at least one first electrical contact comprises a first metal-semiconductor interface to a first semiconductor layer of the VCSEL array, each second electrical contact comprises a second metal-semiconductor interface to a second semiconductor layer of the VCSEL array, and wherein the respective current path is defined between the first metal-semiconductor interface and the second metal-semiconductor interface.

4. The VCSEL array according to claim 1, wherein the current paths are arranged such that a length of a longest current path along the substrate and the respective VCSEL is smaller than 4 times a shortest current path along the substrate and the respective VCSEL.

5. The VCSEL array according to claim 1, wherein the current paths are arranged such that a difference of an electrical impedance of the different current paths along the substrate and the respective VCSELs is smaller than 50% of a smallest impedance of the current paths.

6. The VCSEL array according to claim 2, wherein the current paths are arranged such that electrical impedances of the current paths along the respective VCSELs of the first VCSEL sub-array are the same as electrical impedances of the current path along the respective VCSEL of the second VCSEL subarray.

7. The VCSEL array according to claim 5, wherein the current paths are arranged such that the electrical impedance of the current paths along the respective VCSELs is the same.

8. The VCSEL array according to claim 1, wherein the VCSELs are bottom emitters.

9. The VCSEL array according to claim 8, wherein the VCSEL array comprises a flip chip arrangement comprising a multitude of bumps, wherein the bumps are arranged to mount the VCSEL array on a carrier, wherein the bumps are further arranged to provide an electrical connection to the first electrical contact arrangement and the second electrical contact arrangement, and wherein the bumps are arranged on a side of the substrate opposite to a light emission side of the VCSEL array.

10. The VCSEL array according to claim 8 comprising at least one optical structure, wherein the optical structure is arranged in a side of the substrate opposite to the side on which the VCSELs are arranged, wherein the optical structure is arranged to transform laser light emitted by the VCSEL array during operation of the VCSEL array, wherein the optical structure is mechanically protected by a protection structure comprising substrate material comprised by the substrate, wherein the protection structure is arranged to avoid mechanical contact to the optical structure.

11. The VCSEL array according to claim 10, wherein the protection structure is aligned with bumps such that a bending of the substrate between two of the bumps is reduced when a force perpendicular to a plane of the VCSEL array is exerted to the protection structure.

12. A light emitting device comprising the VCSEL array according to claim 1 and an electrical driver for providing an electrical drive current to the VCSELs.

13. A time-of-flight camera comprising the light emitting device according to claim 12, the time-of-flight camera further comprising a light detector for detecting laser light reflected by an object and an evaluator, wherein the evaluator is configured to determine a distance to the object based on the laser light detected by the light detector.

14. A method of manufacturing a laser arrangement, the method comprising:

providing a Vertical Cavity Surface Emitting Laser (VCSEL) array comprising at least two VCSEL sub-arrays, wherein each of the VCSEL sub-arrays comprises a plurality of VCSELs arranged on a substrate, each VCSEL having an optical resonator comprising a first distributed Bragg reflector, an active layer, and a second distributed Bragg reflector, wherein each VCSEL is processed on the substrate, and wherein a current distribution layer is disposed within one of the first distributed Bragg reflector and the second distributed Bragg reflector, providing a first electrical contact arrangement having a first contact area contacting the substrate or the current distribution layer, wherein the first electrical contact arrangement comprises at least one first electrical contact contacting commonly to the VCSELs within a respective VCSEL sub-array, of the VCSEL sub-arrays, at the first contact area to the optical resonator of the respective VCSEL via the substrate or via the current distribution layer, and providing a second electrical contact arrangement having a second contact area contacting an uppermost layer of the second distributed Bragg reflector, wherein the second electrical contact arrangement comprises a plurality of second electrical contacts, each second electrical contact contacting a respective single VCSEL within the respective VCSEL sub-array, individually, at the second contact area to a semiconductor layer of the optical resonator of the respective VCSEL, wherein the second electrical contacts are arranged to electrically pump the associated VCSEL along a respective current path through the optical resonator of the associated VCSEL between the first contact area and the second contact area via the substrate or the current distribution layer, wherein an arrangement of the at least one first electrical contact and the second electrical contacts has at least one symmetry selected from the group of rotation symmetry, mirror symmetry, and translation symmetry, wherein the first electrical contact arrangement and the second electrical contact arrangement are arranged on a same side of the substrate.

15. The VCSEL array according to claim 4, wherein the current paths are arranged such that the length of the longest current path along the substrate and the respective VCSEL is smaller than 1.5 times a length of the shortest current path along the substrate and the respective VCSEL.

16. The VCSEL array according to claim 5, wherein the current paths are arranged such that the difference of the electrical impedance of the different current paths along the substrate and the respective VCSELs is smaller than 10% of the smallest impedance of the current paths.

* * * * *